(12) United States Patent
Takahashi et al.

(10) Patent No.: US 10,287,499 B2
(45) Date of Patent: May 14, 2019

(54) ETCHING GAS COMPOSITION FOR SILICON COMPOUND, AND ETCHING METHOD

(71) Applicant: KANTO DENKA KOGYO CO., LTD., Tokyo (JP)

(72) Inventors: Yoshinao Takahashi, Gunma (JP); Korehito Kato, Gunma (JP)

(73) Assignee: KANTO DENKA KOGYO CO., LTD., Chiyoda-Ku, Tokyo (JP)

( * ) Notice: Subject to any disclaimer, the term of this patent is extended or adjusted under 35 U.S.C. 154(b) by 1 day.

(21) Appl. No.: 15/518,100

(22) PCT Filed: Aug. 12, 2015

(86) PCT No.: PCT/JP2015/072827
§ 371 (c)(1),
(2) Date: Apr. 10, 2017

(87) PCT Pub. No.: WO2016/056300
PCT Pub. Date: Apr. 14, 2016

(65) Prior Publication Data
US 2018/0251679 A1   Sep. 6, 2018

(30) Foreign Application Priority Data

Oct. 10, 2014   (JP) .................. 2014-208668

(51) Int. Cl.
*C09K 13/08* (2006.01)
*H01L 21/311* (2006.01)
(Continued)

(52) U.S. Cl.
CPC .......... *C09K 13/08* (2013.01); *H01L 21/3065* (2013.01); *H01L 21/31116* (2013.01); *H01L 21/32135* (2013.01)

(58) Field of Classification Search
None
See application file for complete search history.

(56) References Cited

U.S. PATENT DOCUMENTS 5,350,480 A * 9/1994 Gray ................. H01L 21/02071
134/31
2005/0241671 A1* 11/2005 Dong .................. C23C 16/4405
134/1.1
(Continued)

FOREIGN PATENT DOCUMENTS

JP   07193055 A   7/1995
JP   08153711 A   6/1996
(Continued)

OTHER PUBLICATIONS

International Search Report of PCT/JP2015/072827.

*Primary Examiner* — Allan W. Olsen
(74) *Attorney, Agent, or Firm* — Browdy and Neimark, PLLC

(57) ABSTRACT

Provided are an etching gas composition and an etching method which enable an object, such as a substrate to be etched, to be efficiently precision processed during thin film formation, and which enable efficient removal of an accumulated or adhered silicon-based compound, other than the object such as the substrate to be etched, by means of plasma etching. The etching gas composition is characterized by containing: (1) a fluorinated halogen compound represented by XF (X is Cl, Br or I) as a primary component; (2) $F_2$; (3) a fluorinated halogen compound represented by $XF_n$ (X is Cl, Br or I, and n is an integer of 3 or higher); (4) HF; (5) $O_2$; and (6) at least one type of halogen gas molecule selected from among $Cl_2$, $Br_2$ and $I_2$.

6 Claims, 2 Drawing Sheets

(51) Int. Cl.
*H01L 21/3213* (2006.01)
*H01L 21/3065* (2006.01)

(56) References Cited

U.S. PATENT DOCUMENTS

| | | | |
|---|---|---|---|
| 2012/0292610 A1* | 11/2012 | Wang | H01L 29/42384 257/43 |
| 2013/0105728 A1 | 5/2013 | Umezaki et al. | |
| 2014/0206196 A1 | 7/2014 | Umezaki et al. | |
| 2016/0086814 A1* | 3/2016 | Takahashi | H01L 21/31116 438/724 |

FOREIGN PATENT DOCUMENTS

| | | | |
|---|---|---|---|
| JP | 08167597 | A | 6/1996 |
| JP | 09321025 | A | 12/1997 |
| JP | 2007311827 | A | 11/2007 |
| JP | 2012114402 | A | 6/2012 |
| JP | 2013070012 | A | 4/2013 |

* cited by examiner

ETCHING GAS COMPOSITION FOR SILICON COMPOUND, AND ETCHING METHOD

TECHNICAL FIELD

The present invention relates to an etching gas composition and an etching method and particularly to an etching gas composition and an etching method for selectively etching a silicon compound deposited on a semiconductor substrate, without using plasma.

BACKGROUND ART

In the semiconductor industry that has achieved remarkable development in recent years, a thin film formation process using CVD, vacuum deposition, or the like constitutes an indispensable important part of a manufacturing process, and currently a large number of thin film formation apparatuses, etching apparatuses, and cleaning apparatuses operate. The greatest problems when these apparatuses are used are that large amounts of deposits and adhering materials form on places other than a substrate of interest, and etching occurs on objects other than the target substrate.

The removal of these deposits and adhered materials is generally performed by a wet method with a strong acid or a dry method with $ClF_3$ or $F_2/N_2$.

For example, Patent Literature 1 discloses a technique of etching a silicon oxide film formed on the surface of an object to be treated, using an interhalogen gas (ClF, $ClF_3$, $ClF_5$, BrF, $BrF_5$, IF, $IF_3$, $IF_5$, and $IF_7$ as examples), a gas comprising a compound of oxygen and a halogen ($OF_2$ gas as an example), and a compound comprising a hydrogen atom ($H_2O$ gas, alcohol gas, methane gas, and hydrogen gas as examples), and then etching the object to be treated, with either gas of the interhalogen gas and the compound comprising oxygen and a halogen. For $ClF_3$, which is an interhalogen gas, the etching rate of a silicon oxide film is very slow, and therefore in the etching of an object to be treated having natural oxide film of silicon formed thereon, wet etching pretreatment using dilute hydrofluoric acid is necessary. Advantages of using a gas comprising hydrogen together with the interhalogen gas and cooling the object to be treated are that the object to be treated can be etched in a state close to a wet state and moreover the object to be treated on which the silicon natural oxide film is formed can be etched without pretreatment. On the other hand, it is necessary to cool the object to be treated, and debris released by the etching of the object to be treated may remain without gasifying.

In addition, Patent Literature 2 discloses a technique of using a halogen fluoride gas selected from $ClF_3$, ClF, BrF, $BrF_3$, IF, and $IF_3$ and irradiating an object to be treated, with light (ultraviolet light or laser light) to anisotropically etch tungsten silicide or molybdenum silicide that is the object to be treated. An advantage is that the halogen fluoride gas is excited by ultraviolet light or laser light, and therefore it is not necessary to use plasma, and therefore etching that does not cause plasma damage to a semiconductor device can be performed, but a problem is that the light damages the object to be treated.

Further, Patent Literature 3 discloses a technique of using a mixed gas of a fluorine-based gas selected from $ClF_3$, ClF, $NF_3$, $F_2$, and HF and a chlorine-based gas selected from $Cl_2$ and HCl and irradiating a substrate with ultraviolet rays for excitation to continuously etch a silicon nitride film and a silicon film. The etching rate of the fluorine-based gas is higher in the order of silicon, silicon nitride, and silicon oxide, and on the other hand the chlorine-based gas is characterized by etching silicon but not etching silicon nitride or silicon oxide at all. An advantage is that by controlling the partial pressures of the fluorine-based gas and the chlorine-based gas, the silicon nitride film and the silicon film can be continuously etched without damaging the base. But, also in this method, damage to the object to be treated is caused by irradiation with ultraviolet rays.

On the other hand, Patent Literature 4 discloses a technique of etching only a silicon support substrate using ClF, $ClF_3$, BrF, $BrF_3$, IF, or $IF_3$ as a halogen fluoride, to separate a semiconductor integrated circuit made on the silicon substrate, and also discloses a method in which in non-plasma etching using these gases, a silicon oxide film is not etched at all, and therefore only a silicon support substrate can be selectively etched, and a semiconductor integrated circuit can be separated without being damaged.

In addition, in a dry method, generally, an etching gas selected from various fluorine-based gases such as $NF_3$, $SF_6$, and $CF_4$ is used from the viewpoint of the rapidity of the etching rate, the ease of operation, and the like. But, for etching using $NF_3$, $SF_6$, or the like, a plasma atmosphere is usually needed, and therefore the apparatus is greatly restricted, and another problem is that the gas itself (impurities contained in the gas, or by-products produced in processing and removal) is a new contamination source for a target substrate.

CITATION LIST

Patent Literature

Patent Literature 1: Japanese Patent Laid-Open No. 7-193055
Patent Literature 2: Japanese Patent Laid-Open No. 8-167597
Patent Literature 3: Japanese Patent Laid-Open No. 9-321025
Patent Literature 4: Japanese Patent Laid-Open No. 2007-311827

SUMMARY OF INVENTION

Technical Problem

It is an object of the present invention to solve the problems as described above and to provide an etching gas composition and an etching method with which a target such as a substrate of interest can be efficiently precision-processed during thin film formation.

In addition, it is an object of the present invention to provide an etching gas composition and an etching method for efficiently removing by plasmaless etching a silicon-based compound deposited or adhered in a place other than a target such as the substrate of interest.

Solution to Problem

The present inventors have studied diligently in order to achieve the above objects, and as a result found that in order to efficiently and precisely process a deposit of a silicon-based compound forming during thin film formation, a gas composition comprising a halogen fluoride compound having one fluorine atom in the molecule (the halogen is a halogen other than a fluorine atom) such as ClF, BrF, or IF, as a major component and $F_2$ as a minor component is effective, leading to the completion of the present invention.

According to the present invention, the following aspects are provided.

[1] An etching gas composition comprising (1) a halogen fluoride compound represented by XF (X is Cl, Br, or I) as a main component and further comprising (2) $F_2$, (3) a halogen fluoride compound represented by $XF_n$ (X is Cl, Br, or I, and n is an integer of 3 or more), (4) HF, (5) $O_2$, and (6) at least one halogen gas selected from $Cl_2$, $Br_2$, and $I_2$.

[2] The etching gas composition according to [1], comprising 90.00 vol % to 99.999 vol % of (1) the halogen fluoride compound represented by XF (X is Cl, Br, or I), 0.000005 vol % to 0.20 vol % of the sum of (2) $F_2$ and (6) the halogen gas, 0.000005 vol % to 0.10 vol % of (3) the halogen fluoride compound represented by $XF_n$ (X is Cl, Br, or I, and n is an integer of 3 or more), 0.000003 vol % to 0.30 vol % of (4) HF, and (5) the balance of $O_2$.

[3] The etching gas composition according to [1], comprising 90.00 vol % to 99.999 vol % of (1) the halogen fluoride compound represented by XF (X is Cl, Br, or I), 0.000005 vol % to 0.20 vol % of the sum of (2) $F_2$ and (6) the halogen gas, 0.000005 vol % to 0.10 vol % of (3) the halogen fluoride compound represented by $XF_n$ (X is Cl, Br, or I, and n is an integer of 3 or more), 0.000003 vol % to 0.30 vol % of (4) HF, (5) the balance of, $O_2$ and a diluent.

[4] A method for etching or processing a semiconductor substrate via excitation of an etching gas by thermal energy, comprising processing or etching a deposit or thin film of a silicon compound selected from crystalline silicon, amorphous silicon, polycrystalline silicon, SiC, SiOC, SiOCN, SiON, SiCN, SiN, $SiO_m$ (m is a natural number), Poly-Si, and Poly-$SiO_m$ (m is a natural number) using the etching gas composition according to any one of [1] to [3] and without using plasma.

[5] A method for etching or processing a semiconductor substrate via excitation of an etching gas by thermal energy, comprising processing or etching a deposit or thin film of a silicon compound selected from crystalline silicon, amorphous silicon, polycrystalline silicon, SiC, SiOC, SiOCN, SiON, SiCN, SiN, $SiO_m$ (m is a natural number), Poly-Si, and Poly-$SiO_m$ (m is a natural number) using the etching gas composition according to any one of [1] to [3] at an etching temperature of −10° C. to 800° C. and without using plasma.

[6] The etching method according to [5], wherein the etching temperature is 0° C. to 400° C.

Advantageous Effects of Invention

According to the present invention, an etching gas composition and an etching method which solve the problems in the conventional etching gas compositions and etching methods and with which selective etching can be performed without using plasma are provided.

The etching gas composition and etching method of the present invention achieve the following effects.
1) The etching rate under a high temperature (200° C. or more) condition can be controlled.
2) The etching gas composition is a gas having low reactivity and therefore exhibits excellent etching selectivity in various temperature regions. Therefore, only a silicon-based compound deposited in a place other than a target semiconductor substrate can be selectively etched and efficiently and economically removed.
3) Etching under a low temperature (100° C. or less) condition is also possible, and the productivity can be improved, and the etching is also economically advantageous.

DESCRIPTION OF EMBODIMENTS

Figure 1:
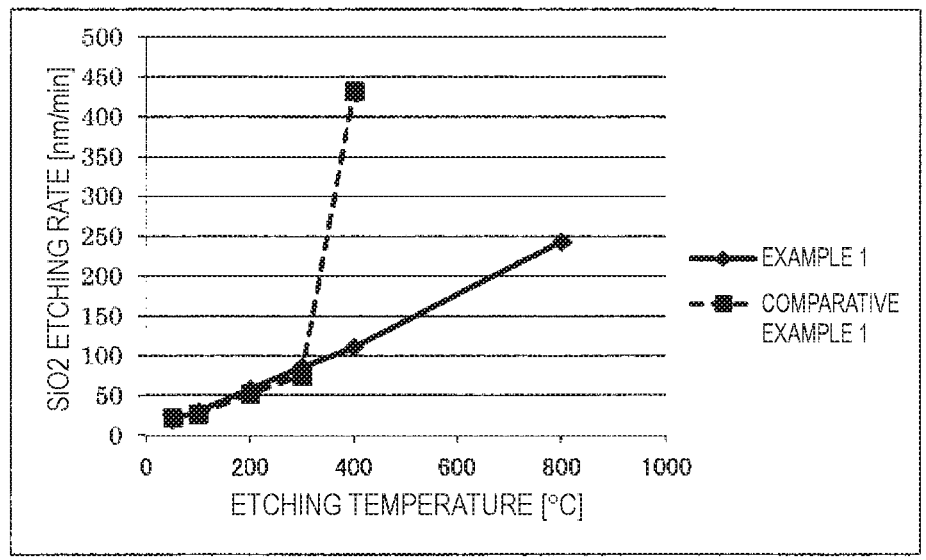
FIG. 1 is a graph showing etching rates in Example 1 and Comparative Example 1.

The etching gas composition of the present invention comprises (1) a halogen fluoride compound represented by XF (X is Cl, Br, or I) as the main component and further comprises (2) $F_2$, (3) a halogen fluoride compound represented by $XF_n$ (X is Cl, Br, or I, and n is an integer of 3 or more), (4) HF, (5) $O_2$, and (6) at least one halogen gas selected from $Cl_2$, $Br_2$, and $I_2$. Particularly, the etching gas composition of the present invention is preferably an etching gas composition comprising 90.00 vol % to 99.999 vol % of (1) the halogen fluoride compound represented by XF (X is Cl, Br, or I), 0.000005 vol % to 0.20 vol % of the sum of (2) $F_2$ and (6) the halogen gas, 0.000005 vol % to 0.10 vol % of (3) the halogen fluoride compound represented by $XF_n$ (X is Cl, Br, or I, and n is an integer of 3 or more), 0.000003 vol % to 0.30 vol % of (4) HF, and (5) the balance of $O_2$, or an etching gas composition comprising 90.00 vol % to 99.999 vol % of (1) the halogen fluoride compound represented by XF (X is Cl, Br, or I), 0.000005 vol % to 0.20 vol % of the sum of (2) $F_2$ and (6) the halogen gas, 0.000005 vol % to 0.10 vol % of (3) the halogen fluoride compound represented by $XF_n$ (X is Cl, Br, or I, and n is an integer of 3 or more), 0.000003 vol % to 0.30 vol % of (4) HF, (5) the balance of, $O_2$ and a diluent. Further, the etching gas composition of the present invention is more preferably an etching gas composition comprising 90.00 vol % to 99.90 vol % of (1) the halogen fluoride compound represented by XF (X is Cl, Br, or I), 0.0005 vol % to 0.20 vol % of the sum of (2) $F_2$ and (6) the halogen gas, 0.0005 vol % to 0.10 vol % of (3) the halogen fluoride compound represented by $XF_n$ (X is Cl, Br, or I, and n is an integer of 3 or more), 0.0003 vol % to 0.30 vol % of (4) HF, and (5) the balance of $O_2$, or an etching gas composition comprising 90.00 vol % to 99.90 vol % of (1) the halogen fluoride compound represented by XF (X is Cl, Br, or I), 0.0005 vol % to 0.20 vol % of the sum of (2) $F_2$ and (6) the halogen gas, 0.0005 vol % to 0.10 vol % of (3) the halogen fluoride compound represented by XF (X is Cl, Br, or I, and n is an integer of 3 or more), 0.0003 vol % to 0.30 vol % of (4) HF, (5) the balance of, $O_2$ and a diluent.

As the diluent, inert gases (rare gases, or gases that do not react with an object to be etched) such as nitrogen gas, argon gas, and helium gas that do not influence etching treatment can be used. The dilution concentration is not particularly limited, and the diluent can be used at a diluent concentration of 0.001 vol % to 99.9 vol % based on the entire etching gas composition, and the diluent concentration is preferably 0.01 vol % to 99.0 vol % based on the etching gas composition.

Since the halogen fluoride compound represented by XF (X is Cl, Br, or I) contained as the main component in the etching gas composition of the present invention has lower reactivity than $ClF_3$ or $BrF_3$ contained as the main component in conventional etching gas compositions, the compound does not induce excessibly deep etching in various temperature regions, and the halogen fluoride compound represented by XF has high selectivity for a material to be etched, and therefore the control of etching is easy.

In addition, the etching method of the present invention is a method for etching or processing a semiconductor substrate by the excitation of an etching gas by thermal energy, comprising processing or etching a deposit or thin film of a silicon compound selected from crystalline silicon, amorphous silicon, polycrystalline silicon, SiC, SiOC, SiOCN, SiON, SiCN, SiN, $SiO_m$ (m is a natural number), Poly-Si, and Poly-$SiO_m$ (m is a natural number) using the etching gas composition of the present invention and without using plasma.

Examples of the object to be etched can include a substrate on which a single layer such as a single Si film, SiC film, $SiO_m$ (m is a natural number) film, or Poly-$SiO_m$ (m is a natural number) film (polysilica film) is formed, a substrate on which a $SiO_2$ film is formed on a SiC film, a substrate on which a $SiO_2$ film is formed on a SiN film, a multilayer substrate on which a SiN film is formed on a Si single-layer film, and a $SiO_2$ film is formed on the SiN film, a substrate on which a Poly-$SiO_m$ (m is a natural number) film (polysilica film) is layered on a SiN film, or a substrate on which many layered films are formed, for example, a SiN film is layered on a SiC film, a $SiO_2$ film is layered on the SiN film, and a Poly-$SiO_m$ (m is a natural number) film is further layered on the $SiO_2$ film. The etching gas composition of the present invention exhibits excellent selectivity and therefore is suitable for etching a particular layer of a multilayer film substrate.

The etching temperature can be in the range of $-10°$ C. to $800°$ C. and is preferably in the range of $0°$ C. to $600°$ C., further preferably in the range of $0°$ C. to $400°$ C. When an object to be etched is selected, and etching is efficiently carried out, particularly $0°$ C. to $100°$ C. is preferred. On the other hand, when etching is carried out while the temperature is controlled, particularly the range of $100°$ C. to $600°$ C. is preferred, and further the range of $100°$ C. to $400°$ C. is particularly preferred. The etching rate with the etching gas composition of the present invention increases with temperature increase, but etching rate increase accompanying temperature increase is gentle compared with a conventional etching gas composition comprising $ClF_3$ or $BrF_3$ as the main component, and therefore etching rate control by temperature control is easy. In other words, the etching gas composition of the present invention has excellent material selectivity at $0°$ C. to $100°$ C. in the etching of a Si-based compound (and its deposit). In addition, the etching gas composition of the present invention achieves the effect of having high temperature controllability at $200°$ C. or more, particularly at $200°$ C. to $400°$ C. Work can be performed even at a high temperature of $200°$ C. or more, and therefore the etching gas composition of the present invention also achieves the effect of reducing apparatus downtime and improving the apparatus operating ratio. Further, even at a low temperature of $100°$ C. or less, selective etching processing for the film of a specific Si-based compound, for example, SiN, is possible under a condition in which plasma is not used, and therefore damage to an apparatus such as a semiconductor manufacturing apparatus can be reduced.

As the etching pressure, 0 Pa to $1.0 \times 10^5$ Pa, particularly about $1.3 \times 10^2$ Pa to $5.33 \times 10^4$ Pa (1 torr to 400 torr), is preferred.

EXAMPLES

The present invention will be described in more detail below by Examples and Comparative Examples, but the present invention is not limited to these.

Example 1-1

A $SiO_2$ wafer having a film thickness of 1063 nm on a substrate (substrate thickness 0.725 mm) was placed in an apparatus, the apparatus was filled with an etching gas composition comprising ClF: 96.500 vol %, $ClF_3$: 0.038 vol %, $F_2$: 0.050 vol %, HF: 0.012 vol %, and $O_2$: 3.400 vol %, and etching treatment was performed at $50°$ C. for 30 seconds. After the etching treatment, the film thickness of $SiO_2$ remaining on the substrate was measured and was 1047 nm. The etching rate was calculated based on the difference between the initial film thickness and the film thickness after the treatment and was 20.1 nm/min.

The above etching treatment was repeated five times, and the coefficient of variation (standard deviation/average value×100) was calculated from the average value and standard deviation of the etching rate and was 0.08%.

Example 1-2

The same treatment as in Example 1-1 was performed except that the etching temperature was changed to $100°$ C. An etching rate of 30.5 nm/min and a coefficient of variation of 0.06% were calculated.

Example 1-3

The same treatment as in Example 1-1 was performed except that the etching temperature was changed to $200°$ C. An etching rate of 58.7 nm/min and a coefficient of variation of 0.08% were calculated.

Example 1-4

The same treatment as in Example 1-1 was performed except that the etching temperature was changed to $300°$ C. An etching rate of 86.1 nm/min and a coefficient of variation of 0.07% were calculated.

Example 1-5

The same treatment as in Example 1-1 was performed except that the etching temperature was changed to $400°$ C. An etching rate of 111.2 nm/min and a coefficient of variation of 0.09% were calculated.

Example 1-6

The same treatment as in Example 1-1 was performed except that the etching temperature was changed to $800°$ C. An etching rate of 243.4 nm/min and a coefficient of variation of 0.10% were calculated.

Comparative Example 1-1

The same treatment as in Example 1-1 was performed except that the etching gas composition was changed to ClF: 0.038 vol %, $ClF_3$: 96.500 vol %, $F_2$: 0.050 vol %, HF: 0.012 vol %, and $O_2$: 3.400 vol %. An etching rate of 22.4 nm/min and a coefficient of variation of 0.09% were calculated.

Comparative Example 1-2

The same treatment as in Example 1-2 was performed except that the same etching gas composition as Comparative Example 1-1 was used. An etching rate of 26.9 nm/min and a coefficient of variation of 0.13% were calculated.

Comparative Example 1-3

The same treatment as in Example 1-3 was performed except that the same etching gas composition as Comparative Example 1-1 was used. An etching rate of 52.7 nm/min and a coefficient of variation of 0.10% were calculated.

Comparative Example 1-4

The same treatment as in Example 1-4 was performed except that the same etching gas composition as Comparative Example 1-1 was used. An etching rate of 75.6 nm/min and a coefficient of variation of 0.29% were calculated.

Comparative Example 1-5

The same treatment as Example 1-5 was performed except that the same etching gas composition as Comparative Example 1-1 was used. An etching rate of 431.4 nm/min and a coefficient of variation of 0.86% were calculated.

Example 2-1

A SiN wafer having a film thickness of 300 nm on a substrate (substrate thickness: 0.775 mm) was placed in an apparatus, the apparatus was filled with an etching gas composition of ClF: 92.500 vol %, $ClF_3$: 0.038 vol %, $F_2$: 0.012 vol %, HF: 0.050 vol %, $O_2$: 3.400 vol %, and $N_2$: 4.000 vol %, and etching treatment was performed at 100° C. for 30 seconds. After the etching treatment, the film thickness of SiN remaining on the substrate was 299.3 nm. The etching rate was calculated based on the difference between the initial film thickness and the film thickness after the treatment and was 1.4 nm/min.

The above etching treatment was repeated five times, and the coefficient of variation (standard deviation/average value×100) was calculated from the average value and standard deviation of the etching rate and was 0.05%.

Example 2-5

The etching treatment in Example 1-2 was performed using the etching gas composition used in Example 2-1. The etching rate was calculated, and compared with the etching rate in Example 2-1, the selection ratios $SiO_2/SiN$ and $SiN/SiO_2$ with respect to the substrate material were calculated and were 22.4 and 0.04 respectively.

Example 2-2

The same treatment as in Example 2-1 was performed except that the etching temperature was changed to 200° C. An etching rate of 3.3 nm/min and a coefficient of variation of 0.06% were calculated.

Example 2-6

The etching treatment in Example 1-3 was performed using the etching gas composition used in Example 2-2. The etching rate was calculated, and compared with the etching rate in Example 2-2, the selection ratios $SiO_2/SiN$ and $SiN/SiO_2$ with respect to the substrate material were calculated and were 17.7 and 0.06 respectively.

Example 2-3

The same treatment as in Example 2-1 was performed except that the etching temperature was changed to 300° C. An etching rate of 13.0 nm/min and a coefficient of variation of 0.08% were calculated.

Example 2-7

The etching treatment in Example 1-4 was performed using the etching gas composition used in Example 2-3. The etching rate was calculated, and compared with the etching rate in Example 2-3, the selection ratios $SiO_2/SiN$ and $SiN/SiO_2$ with respect to the substrate material were calculated and were 6.62 and 0.15 respectively.

Example 2-4

The same treatment as in Example 2-1 was performed except that the etching temperature was changed to 400° C. An etching rate of 146.2 nm/min and a coefficient of variation of 0.09% were calculated.

Example 2-8

The etching treatment in Example 1-5 was performed using the etching gas composition used in Example 2-4. The etching rate was calculated, and compared with the etching rate in Example 2-4, the selection ratios $SiO_2/SiN$ and $SiN/SiO_2$ with respect to the substrate material were calculated and were 0.78 and 1.28 respectively.

Comparative Example 2-1

The same treatment as in Example 2-1 was performed except that the etching gas composition was changed to ClF: 0.038 vol %, $ClF_3$: 92.500 vol %, $F_2$: 0.050 vol %, HF: 0.012 vol %, $O_2$: 3.400 vol %, and $N_2$: 4.000 vol %. An etching rate of 1.9 nm/min and a coefficient of variation of 0.15% were calculated.

Comparative Example 2-5

The etching treatment in Comparative Example 1-2 was performed using the etching gas composition used in Comparative Example 2-1. The etching rate was calculated, and compared with the etching rate in Comparative Example 2-1, the selection ratios $SiO_2/SiN$ and $SiN/SiO_2$ with respect to the substrate material were calculated and were 16.8 and 0.06 respectively.

Comparative Example 2-2

The same treatment as in Comparative Example 2-1 was performed except that the etching temperature was changed to 200° C. An etching rate of 3.1 nm/min and a coefficient of variation of 0.16% were calculated.

Comparative Example 2-6

The etching treatment in Comparative Example 1-3 was performed using the etching gas composition used in Comparative Example 2-2. The etching rate was calculated, and compared with the etching rate in Comparative Example 2-2, the selection ratios $SiO_2/SiN$ and $SiN/SiO_2$ with respect to the substrate material were calculated and were 17.1 and 0.06 respectively.

Comparative Example 2-3

The same treatment as in Comparative Example 2-1 was performed except that the etching temperature was changed to 300° C. An etching rate of 84.9 nm/min and a coefficient of variation of 0.33% were calculated.

Comparative Example 2-7

The etching treatment in Comparative Example 1-4 was performed using the etching gas composition used in Comparative Example 2-3. The etching rate was calculated, and compared with the etching rate in Comparative Example 2-3, the selection ratios $SiO_2/SiN$ and $SiN/SiO_2$ with respect to the substrate material were calculated and were 0.89 and 1.12 respectively.

Comparative Example 2-4

The same treatment as in Comparative Example 2-1 was performed except that the etching temperature was changed to 400° C. An etching rate of 731.2 nm/min and a coefficient of variation of 0.92% were calculated.

Comparative Example 2-8

The etching treatment in Comparative Example 1-5 was performed using the etching gas composition used in Comparative Example 2-4. The etching rate was calculated, and compared with the etching rate in Comparative Example 2-4, the selection ratios $SiO_2/SiN$ and $SiN/SiO_2$ with respect to the substrate material were calculated and were 0.59 and 1.68 respectively.

Examples 2-5 to 2-8

Treatment was performed as in Examples 2-1 to 2-4 except that the object to be etched was changed to the $SiO_2$ wafer having a film thickness of 1063 nm on the substrate (substrate thickness 0.725 mm) in Example 1. Etching rates, coefficients of variation, and selection ratios shown in Table 1 were calculated.

Comparative Examples 2-5 to 2-8

Treatment was performed as in Examples 2-5 to 2-8 except that the etching gas composition was changed to the same etching gas compositions as Comparative Examples 2-1 to 2-4. Etching rates, coefficients of variation, and selection ratios shown in Table 1 were calculated.

Example 3-1

A poly-Si wafer having a film thickness of 300 nm on a substrate (substrate thickness: 0.725 mm) was placed in an apparatus, the apparatus was filled with an etching gas composition of ClF: 92.500 vol %, $ClF_3$: 0.038 vol %, $F_2$: 0.012 vol %, HF: 0.050 vol %, $O_2$: 3.400 vol %, and $N_2$: 4.000 vol %, and etching treatment was performed at 100° C. for 30 seconds. After the etching treatment, the film thickness of poly-Si remaining on the substrate was 299.9 nm. The etching rate was calculated based on the difference between the initial film thickness and the film thickness after the treatment and was 0.2 nm/min.

The above etching treatment was repeated five times, and the coefficient of variation (standard deviation/average value×100) was calculated from the average value and standard deviation of the etching rate and was 0.07%.

Comparing the etching rates for poly-Si calculated in Example 3-1 and the etching rates for $SiO_2$ and SiN calculated in Example 2-1 and 2-5, the selection ratios $SiO_2$/poly-Si, poly-Si/$SiO_2$, SiN/poly-Si, and poly-Si/SiN with respect to the substrate material were calculated and were 157.0, 0.01, 7.0, and 0.14 respectively.

Example 3-2

The same treatment as in Example 3-1 was performed except that the etching temperature was changed to 200° C. An etching rate of 170.9 nm/min and a coefficient of variation of 0.07% were calculated.

Comparing the etching rates for poly-Si calculated in Example 3-2 and the etching rates for $SiO_2$ and SiN calculated in Example 2-2 and 2-6, the selection ratios $SiO_2$/poly-Si, poly-Si/$SiO_2$, SiN/poly-Si, and poly-Si/SiN with respect to the substrate material were calculated and were 0.34, 2.92, 0.02, and 51.8 respectively.

Example 3-3

The same treatment as in Example 3-1 was performed except that the etching temperature was changed to 300° C. An etching rate of 375.4 nm/min and a coefficient of variation of 0.10% were calculated.

Comparing the etching rates for poly-Si calculated in Example 3-3 and the etching rates for $SiO_2$ and SiN calculated in Example 2-3 and 2-7, the selection ratios $SiO_2$/poly-Si, poly-Si/$SiO_2$, SiN/poly-Si, and poly-Si/SiN with respect to the substrate material were calculated and were 0.23, 4.37, 0.03, and 28.9 respectively.

Example 3-4

The same treatment as in Example 3-1 was performed except that the etching temperature was changed to 400° C. An etching rate of 413.3 nm/min and a coefficient of variation of 0.12% were calculated.

Comparing the etching rates for poly-Si calculated in Example 3-4 and the etching rates for $SiO_2$ and SiN calculated in Example 2-4 and 2-8, the selection ratios $SiO_2$/poly-Si, poly-Si/$SiO_2$, SiN/poly-Si, and poly-Si/SiN with respect to the substrate material were calculated and were 0.28, 3.61, 0.35, and 2.83 respectively.

Comparative Example 3-1

The same treatment as in Example 3-1 was performed except that the etching gas composition was changed to ClF: 0.038 vol %, $ClF_3$: 92.500 vol %, $F_2$: 0.050 vol %, HF: 0.012 vol %, $O_2$: 3.400 vol %, and $N_2$: 4.000 vol %. Overetching occurred. The etching rate was 604.4 nm/min.

The above etching treatment was repeated five times, and the coefficient of variation (standard deviation/average value×100) was calculated from the average value and standard deviation of the etching rate and was 0.56%.

Comparing the etching rates for poly-Si calculated in Comparative Example 3-1 and the etching rates for $SiO_2$ and SiN calculated in Comparative Example 2-1 and 2-5, the selection ratios $SiO_2$/poly-Si, poly-Si/$SiO_2$, SiN/poly-Si, and poly-Si/SiN with respect to the substrate material were calculated and were 0.05, 18.9, 0.003, and 318.1 respectively.

Comparative Example 3-2

The same treatment as in Comparative Example 3-1 was performed except that the etching temperature was changed to 200° C. Overetching occurred. The etching rate was calculated as 604.3 nm/min, and the coefficient of variation was calculated as 0.63%.

Comparing the etching rates for poly-Si calculated in Comparative Example 3-2 and the etching rates for $SiO_2$ and SiN calculated in Comparative Example 2-2 and 2-6, the selection ratios $SiO_2$/poly-Si, poly-Si/$SiO_2$, SiN/poly-Si, and poly-Si/SiN with respect to the substrate material were calculated and were 0.09, 11.4, 0.01, and 194.9 respectively.

Figure 2:
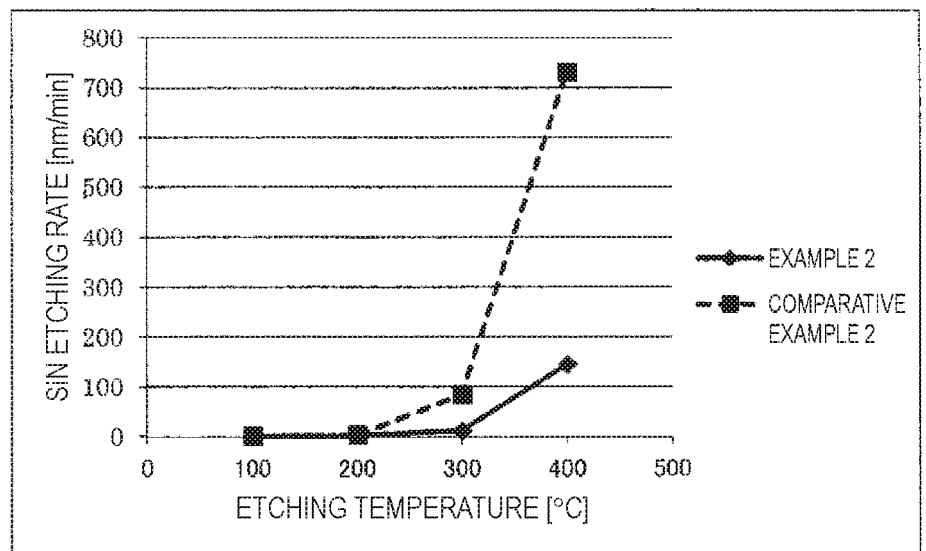
FIG. 2 is a graph showing etching rates for SiN in Example 2 and Comparative Example 2.
Figure 3:
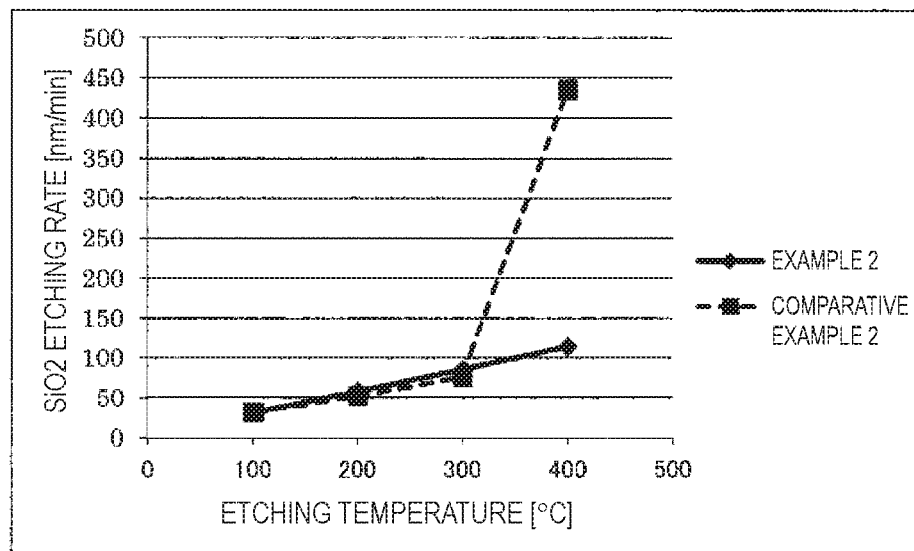
FIG. 3 is a graph showing etching rates for $SiO_2$ in Example 2 and Comparative Example 2.
Figure 4:
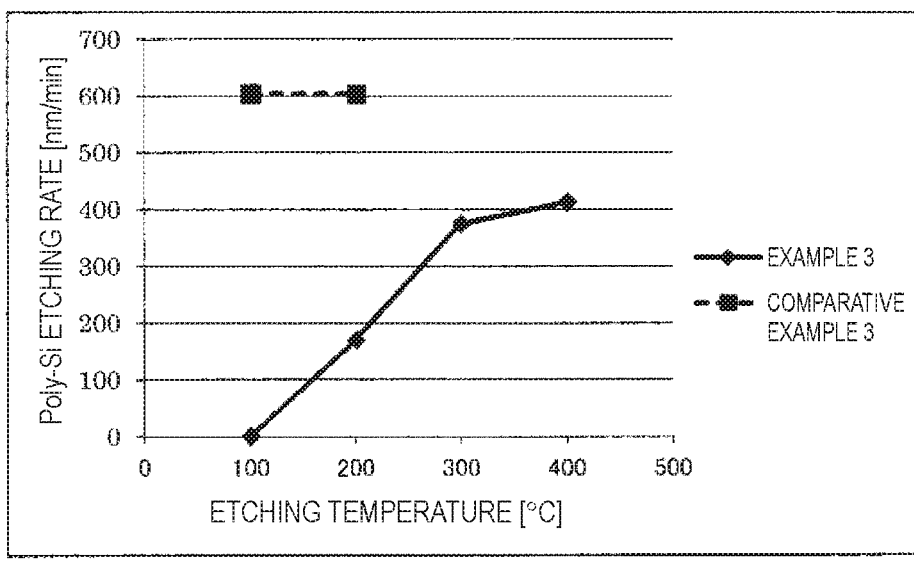
FIG. 4 is a graph showing etching rates for poly-Si in Example 3 and Comparative Example 3.

The results of the Examples and the Comparative Examples are shown in Table 1 and FIGS. 1-4.

example, in the range of 100° C. to 800° C. for $SiO_2$, in the range of 300° C. to 400° C. for SiN, and in the temperature range of 100° C. to 300° C. for poly-Si, the reactivity increases linearly and gently, and etching rate control by temperature control is easy. In addition, it is seen that for the etching gas compositions of the present invention, the coefficient of variation is small, and the variations in etching treatment are small, and therefore the etching gas compositions of the present invention are suitable for precision processing.

The etching gas composition of the present invention achieves the effect of having excellent material selectivity at 0° C. to 100° C. and having high temperature controllability at 200° C. or more in the etching of a Si-based compound (and its deposit). Selective processing at low temperature for the film of a specific Si-based compound is possible under a condition in which plasma is not used, and therefore damage to an apparatus such as a semiconductor manufacturing apparatus can be reduced. In addition, work can be

TABLE 1

| | | Etching gas | Wafer | Temperature ° C. | Etching rate | Coefficient of variation | Selection ratio | | | |
|---|---|---|---|---|---|---|---|---|---|---|
| Example | 1-1 | ClF: 96.5 | $SiO_2$ | 50 | 20.1 | 0.08% | | /SiN | | /poly-Si |
| | 1-2 | $ClF_3$: 0.038 | | 100 | 30.5 | 0.06% | 21.8 | | 152.5 | |
| | 1-3 | $F_2$: 0.05 | | 200 | 58.7 | 0.08% | 17.8 | | 0.34 | |
| | 1-4 | HF: 0.012 | | 300 | 86.1 | 0.07% | 6.62 | | 0.23 | |
| | 1-5 | $O_2$: 3.4 | | 400 | 111.2 | 0.09% | 0.76 | | 0.27 | |
| | 1-6 | | | 800 | 243.4 | 0.10% | | | | |
| Comparative Example | 1-1 | ClF: 0.038 | $SiO_2$ | 50 | 22.4 | 0.09% | | /SiN | | /poly-Si |
| | 1-2 | $ClF_3$: 96.5 | | 100 | 26.9 | 0.13% | 14.2 | | 0.04 | |
| | 1-3 | $F_2$: 0.05 | | 200 | 52.7 | 0.10% | 17.0 | | 0.09 | |
| | 1-4 | HF: 0.012 | | 300 | 75.6 | 0.29% | 0.89 | | | |
| | 1-5 | $O_2$: 3.4 | | 400 | 431.4 | 0.86% | 0.59 | | | |
| Example | 2-1 | ClF: 92.5 | SiN | 100 | 1.4 | 0.05% | 0.04 | /$SiO_2$ | 7.0 | /poly-Si |
| | 2-2 | $ClF_3$: 0.038 | | 200 | 3.3 | 0.06% | 0.06 | | 0.02 | |
| | 2-3 | $F_2$: 0.012 | | 300 | 13.0 | 0.08% | 0.15 | | 0.03 | |
| | 2-4 | HF: 0.05 | | 400 | 146.2 | 0.09% | 1.28 | | 0.35 | |
| | 2-5 | $O_2$: 3.4 | $SiO_2$ | 100 | 31.4 | 0.08% | 22.4 | /SiN | 157 | /poly-Si |
| | 2-6 | $N_2$: 4 | | 200 | 58.5 | 0.08% | 17.7 | | 0.34 | |
| | 2-7 | | | 300 | 86.0 | 0.07% | 6.62 | | 0.23 | |
| | 2-8 | | | 400 | 114.4 | 0.09% | 0.78 | | 0.28 | |
| Comparative Example | 2-1 | ClF: 0.038 | SiN | 100 | 1.9 | 0.15% | 0.06 | /$SiO_2$ | 0.003 | /poly-Si |
| | 2-2 | $ClF_3$: 92.5 | | 200 | 3.1 | 0.16% | 0.06 | | 0.01 | |
| | 2-3 | $F_2$: 0.012 | | 300 | 84.9 | 0.33% | 1.12 | | | |
| | 2-4 | HF: 0.05 | | 400 | 731.2 | 0.92% | 1.68 | | | |
| | 2-5 | $O_2$: 3.4 | $SiO_2$ | 100 | 31.9 | 0.13% | 16.8 | /SiN | 0.05 | /poly-Si |
| | 2-6 | $N_2$: 4 | | 200 | 53.0 | 0.11% | 17.1 | | 0.09 | |
| | 2-7 | | | 300 | 75.5 | 0.29% | 0.89 | | | |
| | 2-8 | | | 400 | 435.0 | 0.86% | 0.59 | | | |
| Example | 3-1 | ClF: 92.5 | poly-Si | 100 | 0.2 | 0.07% | 0.01 | /$SiO_2$ | 0.14 | /SiN |
| | 3-2 | $ClF_3$: 0.038 | | 200 | 170.9 | 0.07% | 2.92 | | 51.8 | |
| | 3-3 | $F_2$: 0.012 | | 300 | 375.4 | 0.10% | 4.37 | | 28.9 | |
| | 3-4 | HF: 0.05 $O_2$: 3.4 $N_2$: 4 | | 400 | 413.3 | 0.12% | 3.61 | | 2.83 | |
| Comparative Example | 3-1 | ClF: 0.038 | poly-Si | 100 | 604.4 | 0.56% | 18.9 | /$SiO_2$ | 318.1 | /SiN |
| | 3-2 | $ClF_3$: 92.5 $F_2$: 0.012 HF: 0.05 $O_2$: 3.4 $N_2$: 4 | | 200 | 604.3 | 0.63% | 11.4 | | 194.9 | |

From the comparison of Examples 1-1 to 1-6 and Comparative Examples 1-1 to 1-5, the comparison of Examples 2-1 to 2-8 and Comparative Examples 2-1 to 2-8, and the comparison of Examples 3-1 to 3-4 and Comparative Examples 3-1 to 3-2, it is seen that for the etching gas compositions of the present invention, compared with the conventional etching gas compositions comprising a trifluoride gas as the main component, in a specific temperature range for the film of a specific Si-based compound, for performed even at higher temperature, and therefore the etching gas composition of the present invention also achieves the effect of reducing apparatus downtime and improving the apparatus operating ratio.

The invention claimed is:
1. An etching gas composition comprising (1) a halogen fluoride compound represented by XF (X is Cl, Br, or I) as a main component and further comprising (2) $F_2$, (3) a halogen fluoride compound represented by $XF_n$ (X is Cl, Br, or I, and n is an integer of 3 or more), (4) HF, (5) $O_2$, and (6) at least one halogen gas selected from $Cl_2$, $Br_2$, and $I_2$.

2. The etching gas composition according to claim 1, comprising 90.00 vol % to 99.999 vol % of (1) the halogen fluoride compound represented by XF (X is Cl, Br, or I), 0.000005 vol % to 0.20 vol % of the sum of (2) $F_2$ and (6) the halogen gas, 0.000005 vol % to 0.10 vol % of (3) the halogen fluoride compound represented by $XF_n$ (X is Cl, Br, or I, and n is an integer of 3 or more), 0.000003 vol % to 0.30 vol % of (4) HF, and (5) the balance of $O_2$.

3. The etching gas composition according to claim 1, comprising 90.00 vol % to 99.999 vol % of (1) the halogen fluoride compound represented by XF (X is Cl, Br, or I), 0.000005 vol % to 0.20 vol % of the sum of (2) $F_2$ and (6) the halogen gas, 0.000005 vol % to 0.10 vol % of (3) the halogen fluoride compound represented by $XF_n$ (X is Cl, Br, or I, and n is an integer of 3 or more), 0.000003 vol % to 0.30 vol % of (4) HF, (5) the balance of, $O_2$ and a diluent.

4. A method for etching or processing a semiconductor substrate via excitation of an etching gas by thermal energy, comprising processing or etching a deposit or thin film of a silicon compound selected from crystalline silicon, amorphous silicon, polycrystalline silicon, SiC, SiOC, SiOCN, SiON, SiCN, SiN, $SiO_m$ (m is a natural number), Poly-Si, and Poly-$SiO_m$ (m is a natural number) using the etching gas composition according to claim 1 and without using plasma.

5. A method for etching or processing a semiconductor substrate via excitation of an etching gas by thermal energy, comprising processing or etching a deposit or thin film of a silicon compound selected from crystalline silicon, amorphous silicon, polycrystalline silicon, SiC, SiOC, SiOCN, SiON, SiCN, SiN, $SiO_m$ (m is a natural number), Poly-Si, and Poly-$SiO_m$ (m is a natural number) using the etching gas composition according to claim 1 at an etching temperature of −10° C. to 800° C. and without using plasma.

6. The etching method according to claim 5, wherein the etching temperature is 0° C. to 400° C.

* * * * *